United States Patent
Gupta et al.

(10) Patent No.: US 6,760,872 B2
(45) Date of Patent: Jul. 6, 2004

(54) CONFIGURABLE AND MEMORY ARCHITECTURE INDEPENDENT MEMORY BUILT-IN SELF TEST

(75) Inventors: Jay K. Gupta, Fremont, CA (US); Somnath Paul, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 457 days.

(21) Appl. No.: 09/812,109

(22) Filed: Mar. 19, 2001

(65) Prior Publication Data

US 2002/0133768 A1 Sep. 19, 2002

(51) Int. Cl.⁷ .............................................. G01R 31/28
(52) U.S. Cl. .................. 714/719; 714/743; 365/230.06
(58) Field of Search .................. 714/718, 719, 714/733, 734, 735, 736, 738, 742, 743, 819, 824; 711/100, 200, 217, 218, 219; 365/200, 201, 189.01, 230.01, 230.06

(56) References Cited

U.S. PATENT DOCUMENTS

| | | | |
|---|---|---|---|
| 4,689,740 A | 8/1987 | Moelands et al. | 364/200 |
| 5,559,502 A | 9/1996 | Schutte | 340/825.21 |
| 5,689,196 A | 11/1997 | Schutte | 326/86 |
| 6,178,532 B1 * | 1/2001 | Pierce et al. | 714/718 |
| 6,272,057 B1 * | 8/2001 | Koshikawa | 365/200 |
| 6,484,278 B1 * | 11/2002 | Merritt et al. | 714/719 |
| 6,577,534 B2 * | 6/2003 | Tsuruda | 365/185.09 |
| 2001/0017804 A1 * | 8/2001 | Ito | 365/201 |

FOREIGN PATENT DOCUMENTS

| | | | |
|---|---|---|---|
| WO | WO96/17305 | 6/1996 | G06F/13/40 |
| WO | WO98/34376 | 8/1998 | H04L/12/20 |
| WO | WO99/09712 | 2/1999 | H04L/12/40 |

* cited by examiner

*Primary Examiner*—Christine T. Tu
(74) *Attorney, Agent, or Firm*—Christopher P. Maiorana, P.C.

(57) ABSTRACT

A circuit that may be used to support testing of a memory block. The circuit generally comprises a decoder and a generator. The decoder may be configured to (i) decode a command signal into an address field, an operation field, and a data field and (ii) present a control signal to the memory block in response to the operation field. The generator may be configured to (i) present an address signal to the memory block in response to the address field and (ii) present a data signal to the memory block in response to the data field.

28 Claims, 5 Drawing Sheets

CONFIGURABLE AND MEMORY ARCHITECTURE INDEPENDENT MEMORY BUILT-IN SELF TEST

FIELD OF THE INVENTION

The present invention relates to a method and/or architecture for built-in self test (BIST) devices generally and, more particularly, to a method and/or architecture for memory architecture independent configurable BIST devices.

BACKGROUND OF THE INVENTION

Conventional built-in self test (BIST) designs for memory blocks are customized for each type of memory block. The BIST designs must give due consideration to a memory size and architecture (scrambling of bits) used within the memory blocks. In the process, the BIST design becomes a specific component that cannot be reused across different products. All of the procedures for testing the memory block are fixed in the BIST design and thus and cannot be changed during the life cycle of the memory block. Also the same BIST design cannot be reused if targeted for different memory architectures.

Figure 1:
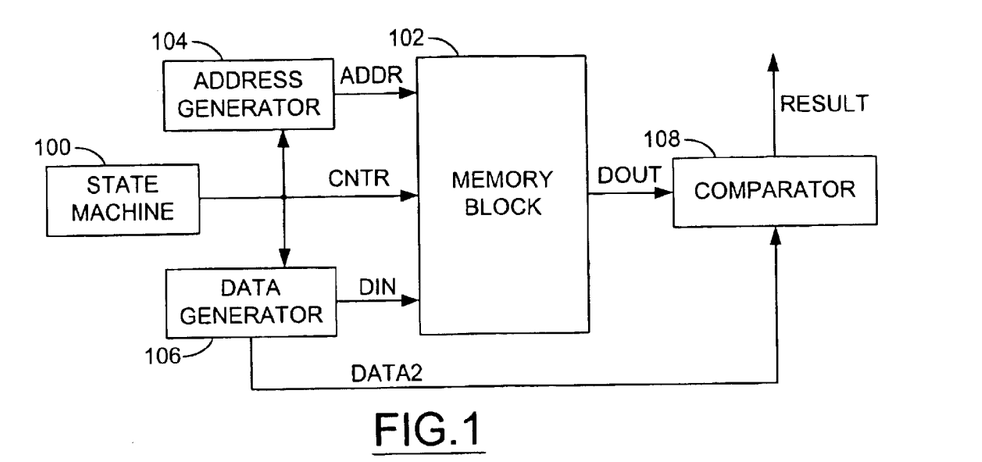
FIG. 1 is a block diagram of a conventional BIST circuit.

Referring to FIG. 1, a block diagram of a general structure of a conventional BIST design is shown. A state machine 100 is hard coded and has preset states. The state machine 100 presents the preset states as a signal (i.e., CNTR) to a memory block 102, an address generator 104, and a data generator 106. The address generator 104 presents a signal (i.e., ADDR) to the memory block 102 in response to the signal CNTR. The data generator 106 presents a signal (i.e., DIN) to the memory block 102 and another signal (i.e., DATA2) to a comparator 108 in response to the signal CNTR. The comparator 108 compares an output signal (i.e., DOUT) from the memory block 102 with the signal DATA2 to present a signal (i.e., RESULT). In each BIST test, the signals CNTR, ADDR, and DIN are used to write predetermined data to the memory block 102, read data from the memory block 102, or both. If the comparator 108 determines that the signal DOUT matches the signal DATA2, then the memory device 102 passes the BIST test in progress.

Figure 2:
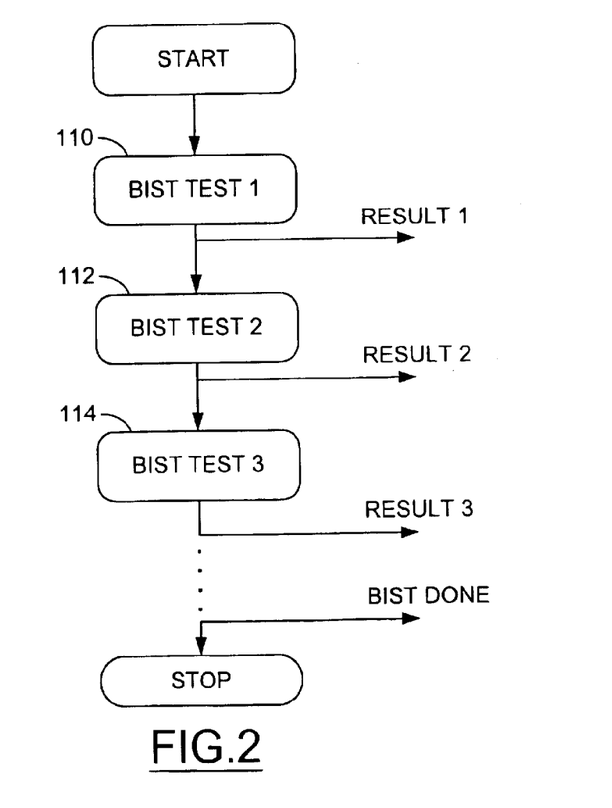
FIG. 2 is a flow chart illustrating an operation of the conventional BIST circuit of FIG. 1.

FIG. 2 is a flow diagram for a sequence of BIST tests. The sequence executes a first test (i.e., block 110) to produce a first result. Subsequent tests (i.e., blocks 112–114) are then executed to produce additional results. After all of the BIST tests have completed, a signal (i.e., BIST DONE) is presented to signal a completion of the testing. Should any procedure of the individual BIST tests 110–114 require additions, modifications, deletions or rearranging, then the state machine 100 and possibly the address generator 104 and the data generator 106 will require a redesign.

SUMMARY OF THE INVENTION

The present invention concerns a circuit that may be used to support testing of a memory block. The circuit generally comprises a decoder and a generator. The decoder may be configured to (i) decode a command signal into an address field, an operation field, and a data field and (ii) present a control signal to the memory block in response to the operation field. The generator may be configured to (i) present an address signal to the memory block in response to the address field and (ii) present a data signal to the memory block in response to the data field.

The objects, features and advantages of the present invention include providing a method and/or architecture for configurable and memory architecture independent built-in self test for memory blocks, devices and circuits that may (i) be reused across different memory architectures and organizations, (ii) execute test procedures of complexity $O(n)$, (iii) reduce test time by executing only selective procedures, (iv) execute some test procedures of a complexity $O(n^2)$ using an extended instruction set, and/or (v) change the test procedures over a life cycle of the memory device.

DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
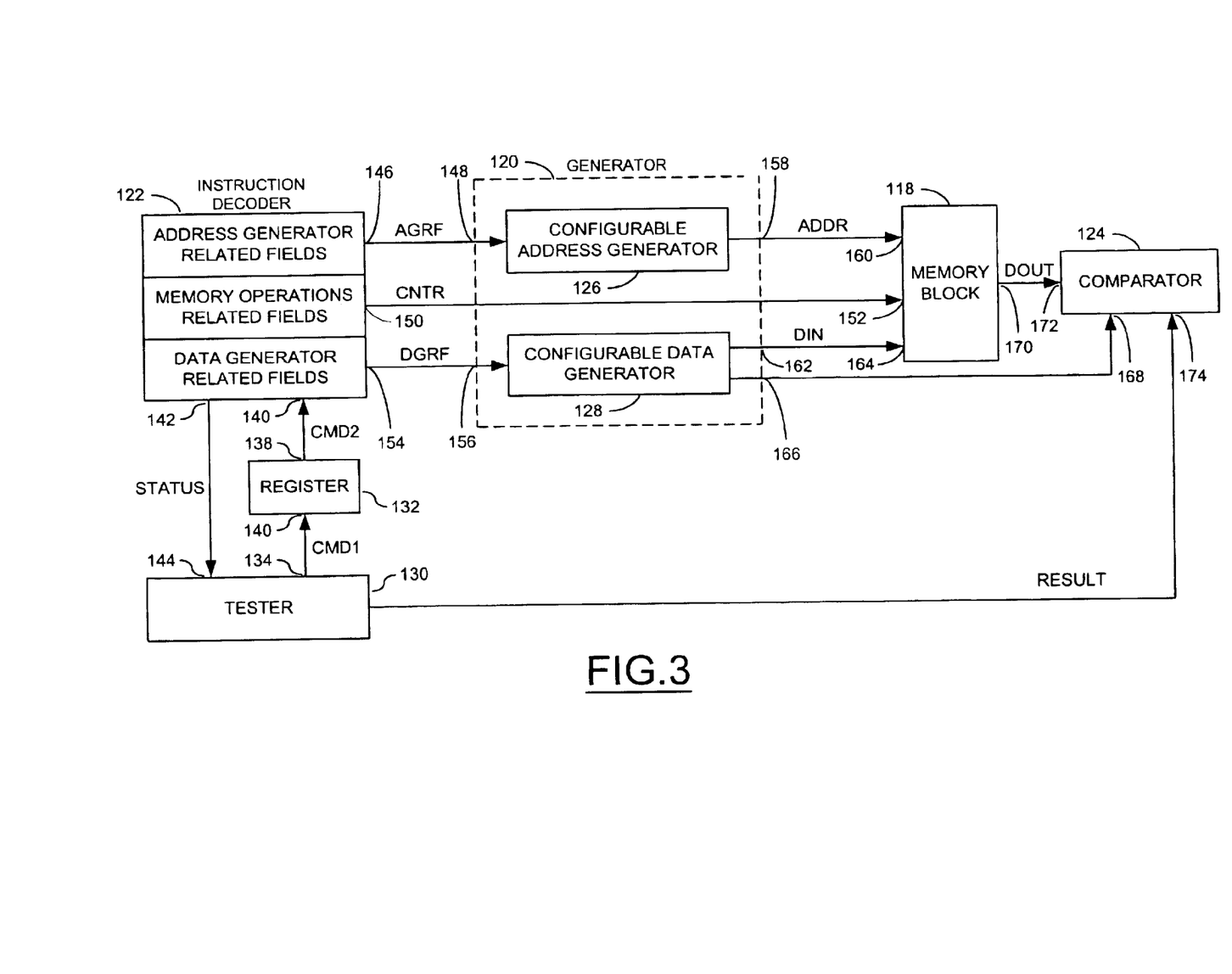
FIG. 3 is a block diagram of a memory system in accordance with a preferred embodiment of the present invention.

Referring to FIG. 3, a block diagram of a memory system 116 is shown in accordance with a preferred embodiment of the present invention. The memory system 116 generally comprises a circuit 118, a circuit 120, a circuit 122, and a circuit 124. The circuit 118 may be implemented as a memory block, circuit, device or array. The circuit 120 may be implemented as a generator 120. The circuit 122 may be implemented as an instruction decoder 122. The circuit 124 may be implemented as a comparator 124. There may be one or more instances of the memory system 116 on a single integrated circuit, module, and/or board.

The generator 120 generally comprises a circuit 126 and another circuit 128. The circuit 126 may be implemented as a configurable address generator. The circuit 128 may be implemented as a configurable data generator.

The memory block 118 may be of any architecture, organization, and/or technology. The memory block 118 may include, but is not limited to static random access memory, dynamic random access memory, read-only memory, programmable read-only memory, erasable read-only memory, nonvolatile memory, flash memory, multi-queue embedded memory, and the like.

Another circuit 130 may be provided internally to the memory system 116, as shown. The circuit 130 may be implemented as a tester. A circuit 132 may be optionally provided between the tester 130 and the instruction decoder 122. The circuit 132 may be implemented as a register or a first-in-first-out memory. In an alternative embodiment, the register 132 and/or the tester 130 may be provided externally to the memory system 116 to meet the design criteria of a particular application.

The tester 130 may have an output 134 to provide a signal (e.g., CMD1) to an input 136 of the register 132. The register 132 may have an output 138 to provide a signal (e.g., CMD2) to an input 140 of the instruction decoder 122. The instruction decoder 122 may have an output 142 to provide a signal (e.g., STATUS) to an input 144 of the tester 130.

The instruction decoder 122 may have an output 146 to provide a signal (e.g., AGRF) to an input 148 of the generator 120. The instruction decoder 122 may have another output 150 to provide a signal (e.g., CNTR) to an input 152 of the memory block 118. The instruction decoder 122 may have another output 154 to provide a signal (e.g., DGRF) to an input 156 of the generator 120.

The generator 120 may have an output 158 to provide a signal (e.g., ADDR) to an input 160 of the memory block 118. The generator 120 may have another output 162 to provide a signal (e.g., DIN) to another input 164 of the memory block 118. The generator 120 may have an output 166 to provide a signal (e.g., DATA2) to an input 168 of the comparator 124.

The memory block 118 may have an output 170 to provide a signal (e.g., DOUT) to an input 172 of the comparator 124. The comparator 124 may have an output 174 to present a signal (e.g., RESULT). The signal RESULT may be provided back to the tester 130 or to some other element involved in evaluating and recording BIST results for the memory system 116.

The signal CMD1 may serve as a command signal having multiple fields. The signal CMD1 may include one or more address related fields, one or more operation related fields, and one or more data related fields. The signal CMD2 may also serve as a command signal. In the presence of the register 132, the signal CMD2 may be the same as the signal CMD1 delayed in time. In the absence of the register 132, the signal CMD2 and the signal CMD1 may be one in the same.

The signal STATUS may serve as a status signal. The signal STATUS may inform the tester 130 when a particular BIST test has completed. The signal STATUS may also be used to inform the register 132 when the particular BIST test has completed.

The signal AGRF may serve to convey an address generator related field. The instruction decoder 122 may present the signal AGRF to program the configurable address generator 126. The signal DGRF may serve to convey a data generator related field. The instruction decoder 122 may present the signal DGRF to program the configurable data generator 128. The signal CNTR may serve as a control. The instruction decoder 122 may present the signal CNTR to control the memory block 118.

The signal ADDR may serve as an address. The configurable address decoder 126 may present the signal ADDR to address the memory block 118. The signal DIN may serve as input data. The configurable data generator 128 may present the signal DIN as write data to the memory block 118. The signal DATA2 may serve as expected data. The configurable data generator 128 may present the signal DATA2 to the comparator 124 when reading from the memory block 118. The signal DATA2 may be used to determine if the memory block 118 presents correct data or not in the signal DOUT.

The signal DOUT may serve to convey output data from the memory block 118. The signal DOUT is generally a final signal that is evaluated to determine if the memory block 118 has passed or failed the BIST test. The signal RESULT may serve to convey the results of each BIST test. The comparator 124 generally updates and presents the signal RESULT at least once for each BIST test executed.

As mentioned earlier, the signals CMD1 and CMD2 may convey address related fields, operation related fields, and data related fields. In a preferred embodiment of the present invention, the data related fields are a data pattern field, a flip enable field, and a flip frequency field. The data pattern field may be 2-bits wide. The data pattern field is generally used in conjunction with the flip enable field and the flip frequency field to generate the signal DIN. In other embodiments, the data pattern field may have a 1-bit width, or a width wider than 2-bits to meet the design criteria of a particular application.

Figure 4:
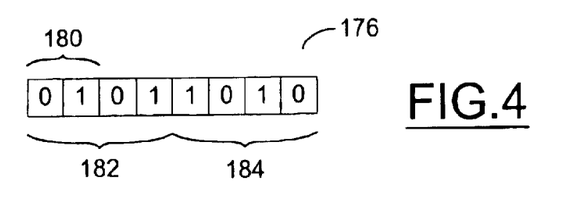
FIG. 4 is a diagram of an 8-bit memory location.

Referring to FIG. 4, a diagram of an 8-bit memory location 176 of one embodiment of the memory block 118 is shown. In order to generate an 8-bit wide data value to write to the 8-bit memory location 176, a 2-bit wide data pattern 180 may be instantiated four times. Given the 2-bit width of the data pattern field, four possible data values (logical one and logical zero patterns) may be generated for the memory location 176.

The flip enable field and the flip frequency field generally allow for additional data values to be generated. A data unit may be defined as a number of instantiations of the data pattern field 180, where the number is an integer of one or greater. The flip frequency field may serve as the number of instantiations of the data pattern field 180 within a data unit. In the example shown in FIG. 4, a first data unit 182 may comprise two instantiations of the data pattern field 180 having binary data bits of 01 binary. Here, the first data unit 182 and a second data unit 184 generally provide the 8-bit width necessary to fill the memory location 176.

The flip enable field may allow additional variations in the data value stored in the memory location 176. The flip enable field may have a true state and a false state. When the flip enable field is in the true state, the bit data in every other data unit may be complemented, as shown in FIG. 4. In other words, each logical zero in the data unit 182 may be inverted to a logical one in an identical bit position within the data unit 184. Each logical one in the data unit 182 may be inverted to a logical zero in an identical bit position within the data unit 184. When the flip enable field has the false state, then each consecutive data unit 182 and 184 may repeat the same bit pattern. In other words, each logical zero in the first data unit 182 may have a logical zero in an identical position within the second data unit 184. Each logical one in the first data unit 182 may have a logical one in an identical position within the second data unit 184. Furthermore, when the flip enable field is in the false state, the flip frequency field may have a don't care state. Since each consecutive data unit is an identical copy of a previous data unit, then the data pattern field 180 may be repeated as many times as necessary without complementing to generate the data value.

In a preferred embodiment of the present invention, the address related fields are an address order field (also referred to as an address increment/decrement mode field), an address toggle mode field, an address stop count field, a flip enable for row field, a flip frequency for row field, a flip enable for column field, and a flip frequency for column field. The address order field generally serves to select between addressing the memory block 118 in either an ascending order or a descending order. The address toggle mode field may serve to select between stepping the signal ADDR in either a binary counter fashion or a toggle-a-maximum-number-of-bits fashion. The binary counter fashion may be a simple increment of the signal ADDR in units of one. For example, the signal ADDR may present address values of 0, 1, 2, 3, and so on. The toggle-a-maximum-number-of-bits fashion generally steps the signal ADDR such that each consecutive address value has a maximum number of bits inverted from a previous address value. For example, the signal ADDR may present address values of 0, F, 1, E, and so on. The toggle-a-maximum-number-of-bits fashion is generally intended to introduce a maximum amount of noise on address lines of the memory block 118 by switching as many of the address lines as possible with each step of the signal ADDR.

The address stop count field generally identifies a depth of the memory block 118. The depth may be expressed in terms of the address values. The address stop count field may be a one time programmable value for each memory structure that may be used in variations of the memory block 118.

Figure 5:
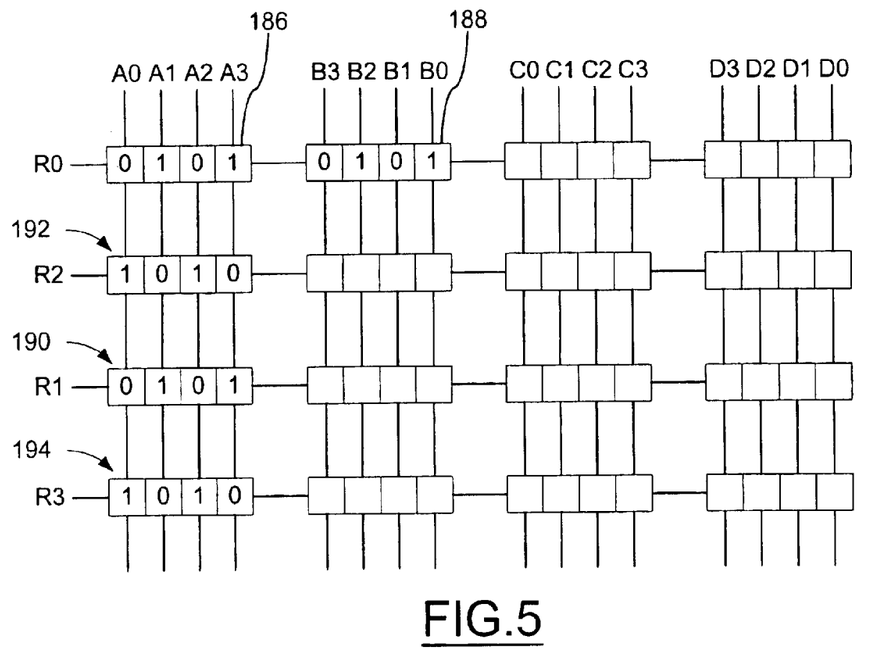
FIG. 5 is a diagram of a 4×4×4 memory architecture.

Referring to FIG. 5, a block diagram of a memory architecture example is shown. Here, 4-bit data words may be stored in a 4-row by 4-column array. The memory architecture along each row and along each column may scramble the physical positions of consecutive bits within address-consecutive memory locations. In particular, the most significant bit (e.g., A3, B3, C3 and D3) of each memory location may be alternated between a left side and right side of the memory location for consecutive memory locations. For example, the most significant bit A3 in a first memory location 186 in a first row (e.g., R0) is on the right side. In contrast, the most significant bit B3 of an adjacent memory location 188 in the first row R0 may be on the left side.

To account for such variations in the memory architecture along rows, the present invention generally provides the flip enable for row (FER) field and the flip frequency for row (FFR) field. Similar to the data unit, a row unit may be defined as a number of memory locations, where the number is an integer of one or greater. The number of memory locations per row unit may be defined by the FFR field. In the example shown in FIG. 5, each row unit may comprise just one memory location along any given row R0–R3. In other words, the FFR field defines a number having a value of one. Therefore, the memory location 186 may also be a first row unit. The second memory location 188 may also be a second row unit.

The FER field may convey a selection between complementing and not complementing the data values in alternating row units. The FER field may have the true state to select complementing and the false state to select not complementing. When the FER field has the false state, the FFR field may have a "don't care" value.

In the example shown in FIG. 5, a first data value written into the first memory location 186 may have a pattern of 0101 binary (least significant bit A0 to most significant bit A3). In order to create a checkerboard pattern in the memory block 118, a second data value may have a second pattern of 1010 binary (least significant bit B0 to most significant bit B3). Here, the second data value (1010 binary) may be a complement of the first data value (0101 binary). To cause the second data value to be the complement of the first data value, the FER may have the true state and the FFR field may have the number set to one.

The memory architecture example shown in FIG. 5 generally has the rows R0–R3 scrambled. Moving from top to bottom, the even rows R0 and R2 are physically arranged by ascending address values followed by the odd rows R1 and R3, also arranged by ascending address values. Consequently, as the data values are written/read from each row R0–R3 in an ascending address order, the first memory location 186 in the row R0 will generally be written/read from first. A memory location 190 in the row R1 will generally be written/read from at a time after the first memory location 186. Another memory location 192 in the row R2 will generally be written/read from at another time after the memory location 190. Finally, still another memory location 194 in the row R3 will generally be written/read from at another time after the memory location 192. To maintain the checkerboard pattern along the A column, data values in the memory locations 192 and 194 may be complemented from the data value in the first memory location 186 and the memory location 190.

The present invention may account for the example shown in FIG. 5 by defining a column unit as a number of memory locations, where the number is an integer of one or greater. The number of memory locations per column unit may be defined by the flip frequency for column (FFC) field. In the example shown in FIG. 5, a first column unit may comprise the first memory location 186 and the memory location 190. A second column unit may comprise the memory location 192 and the memory location 194.

The flip enable for column (FEC) field may convey a selection between complementing and not complementing the data values in alternating column units. The FEC field may have the true state to select complementing and the false state to select not complementing. When the FEC field has the false state, the FFC field may have a "don't care" value.

Returning to the example shown in FIG. 5, the first data value within the first memory location 186 (e.g., 0101 binary) is generally repeated within the first column unit. As a result, the first data value also appears within the memory location 190. The data value stored in the memory locations 192 and 194 of the second column unit may be a complement (e.g., 1010 binary) of the first data value.

The operation related field generally comprise an opcode field. In a preferred embodiment of the present invention, the opcode field may define four operations, one of which may be used in each BIST test. A first operation of the four operations may write to all memory locations and then read from all memory locations within the memory block 118. A second operation may write to all memory locations. A third operation may read from all memory locations. A fourth operation may (i) read from a particular memory location as specified by the data pattern field, (ii) complement the data value read from the particular memory location, (iii) write the complemented data value back into the particular memory location, and then (iv) repeat for all other memory locations of the memory block 118. The four operations may be represented in the opcode field by binary numbers 00 to 11 respectively. The operation related field forms a core of a BIST procedure and decides sub-operations of each DIST test. A group of the operations forms one self-test of the memory block 118.

The coding of values for various fields is just an example and the above-mentioned values are just one possible way of coding. A different coding may be used to implement the present invention. The width and composition of the commands may be any possible combination of arrangement of the fields and groupings.

Figure 6:
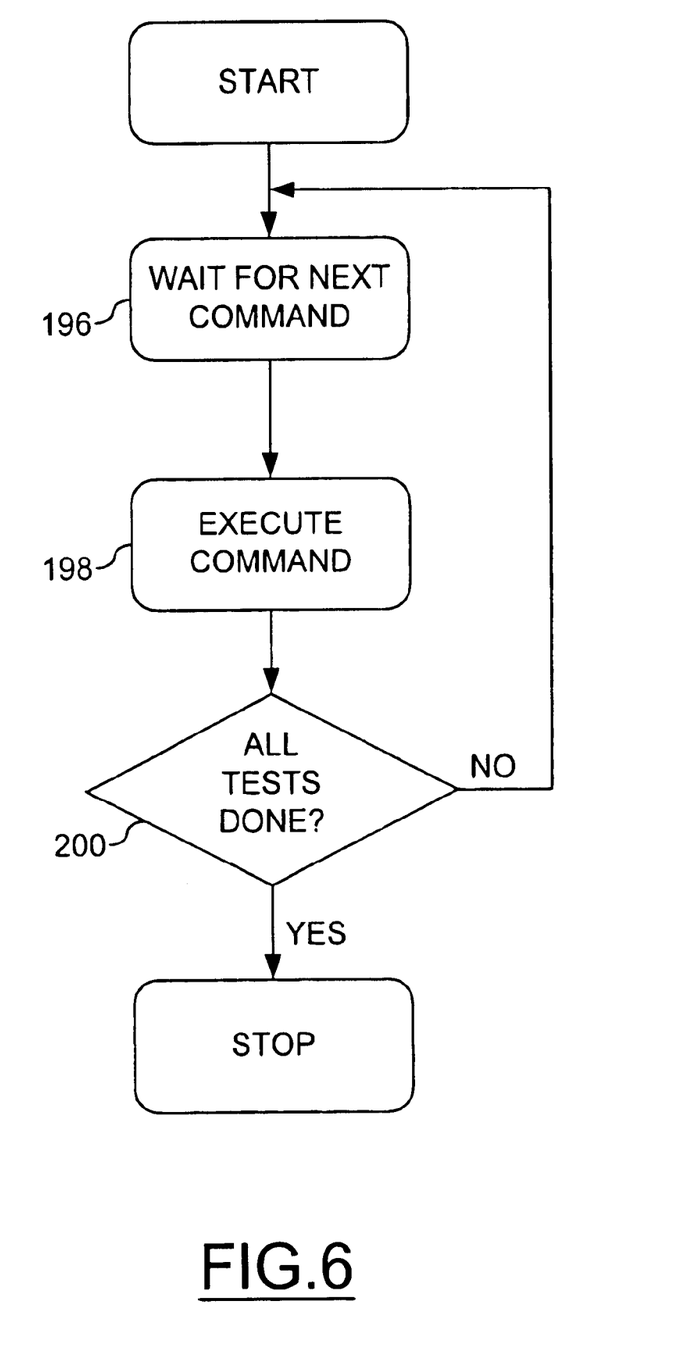
FIG. 6 is a flow chart illustrating an operation of the present invention.

Referring to FIG. 6, a flow diagram of a method of conducting one self-test of the memory block 118 is shown. When the memory system 116 is in a DIST mode, the self-test may begin by waiting for the signal CMD1 from the tester 130 (or the signal CMD2 from the register 132) (e.g., block 196). Upon receipt of the signal CMD1 or CMD2 at the instruction decoder 122, the command conveyed by the signal CMD1 or CMD2 is generally executed (e.g., block 198) by the instruction decoder 122, the generator 120, and the comparator 124. When execution of the command has completed, a check is made to see if there are any additional BIST tests that may require execution (e.g., decision block 200). If there are additional BIST tests to be performed (e.g., the NO branch of decision bock 200), then the operation returns to waiting for the next command (e.g., block 196). If all of the BIST tests are done (e.g., the YES branch of decision block 200), then the self-test ends (e.g., STOP).

In one embodiment of the present invention, the commands presented in the signal CMD1 may be pipelined. Multiple commands may be written to the register 132 and then executed sequentially. The fields within the signals CMD1 and CMD2 that correspond to the data values and patterns generally cover various possible architectures for the memory block 118. The fields corresponding to the addressing and the opcode cover various BIST tests or procedures and various ways of detecting different types of faults within the memory block 118.

The present invention is configurable, by which the self-test of the memory block 118 can be programmed to sequentially execute different BIST procedures. The present invention is not limited by the memory architecture (e.g., various ways of scrambling the bit cells). An instruction set whose various fields cover a complete set of BIST tests may be designed basically independent of any particular memory architecture. By programming the various fields in the tester 130, most of the BIST tests of complexity O(n) for any memory architecture can be implemented. March algorithms implemented by the present invention may have less control logic as compared to the conventional BIST designs.

The programming gives a flexibility of having a very small number of commands to choose from for the tester 130. The programming also provides reuse across different memory block 118 designs. The instruction decoder 122 generates inputs to the configurable data generator 128, the configurable address generator 126, and control signals for the memory block 118. By extending the instruction set, BIST tests of complexity $O(n^2)$ may be programmed and executed. By executing only selective procedures, a time required to test the memory block 118 may be made short.

It should be understood that operations of the memory block 118 during a normal mode are not shown in the figures. Furthermore, both BIST and non-BIST operations will generally coexist in the memory system 116. Consequently, a mechanism (not shown) may exist to bypass the BIST operations during a non-BIST mode.

Figure 7:
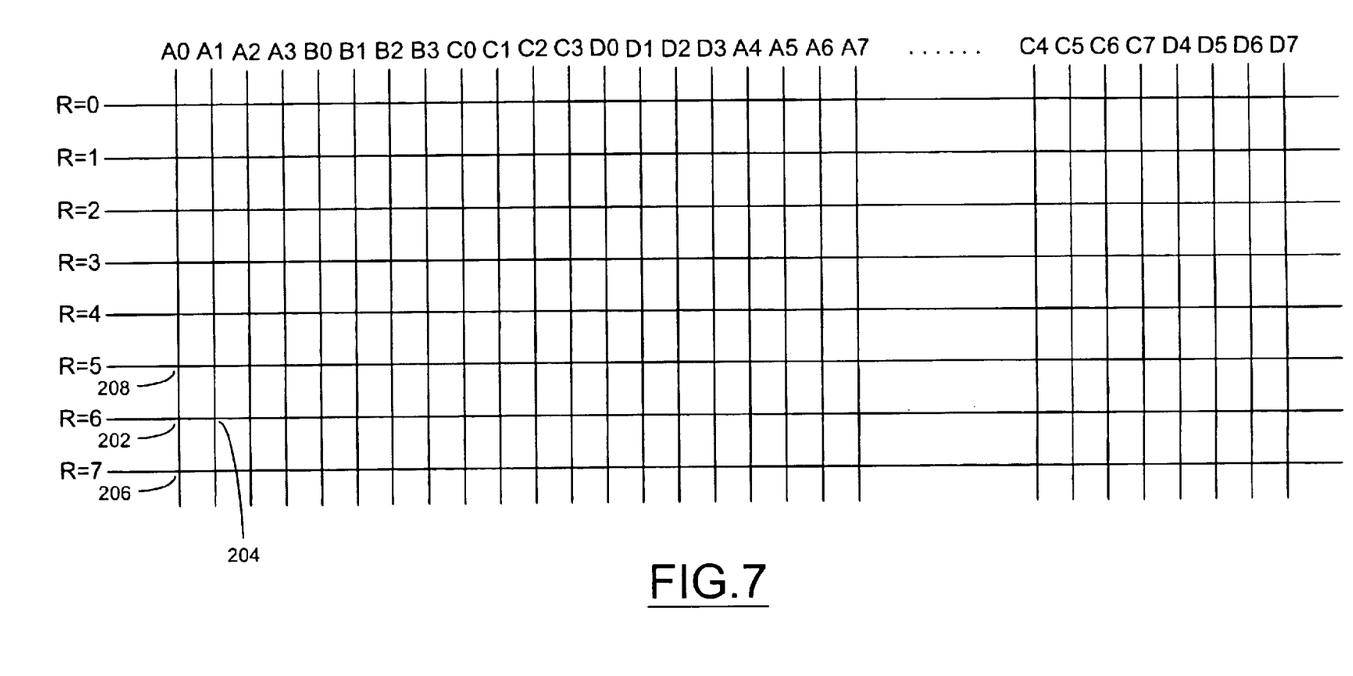
FIG. 7 is a diagram of a second memory architecture example.

FIG. 7 is a diagram of an example memory architecture that will be used to describe an example checkerboard pattern test of the memory block 118. The memory block 118 may have an 8-bit width and each row may have 4 addressable columns, A, B, C and D. Each column A, B, C, and D may be physically divided into two sub-columns. A first sub-column may cover 4 bit lines of the 8 bit lines (e.g., X0–X3, where X represents A, B, C and D). A second sub-column may cover the other 4 bit lines (e.g., X4–X7). Other arrangements of the bit lines A0–D7 may be used to meet the design criteria of a particular application.

The bit lines A0–A7 of the column A generally corresponds to the memory location addresses 4*R, where R is a row number (e.g., R0–R7). The bit lines B0–B7 of the column B generally correspond to the memory location addresses (4*R)+1. The bit lines C0–C7 of the column C generally correspond to the memory location addresses (4*R)+2. The bit lines D0–D7 of the column D generally correspond to the memory location addresses (4*R)+3. The numerals for the bit lines (e.g., 0–7) may correspond to a position of a bit within the memory location (and thus the data value stored therein).

The checkerboard pattern generally requires writing alternating logical zeros and logical ones in physically neighboring bit cells. Consider an example where a logical zero may be written in a first bit cell 202 at the bit line A0 in the row R6. To create the checkerboard pattern a logical one may be written into a neighboring bit cell 204 at the bit line A1 in the row R6. A second logical one may be written into another neighboring bit cell 206 at the bit line A0 in the row R7. A third logical one may also be written into a neighboring bit cell 208 at the bit line A0 in the row R5.

The checkerboard test may involve one command to write to the memory block 118 in the ascending order. A second command may be used to read from the memory block 118 in the descending order. Values of the fields for the first command (write) may be:

Data pattern field=01 binary
Flip enable field=false
Flip frequency field=Don't care
Flip enable for row field=true
Flip Frequency for row field=1
Flip enable for column field=true
Flip frequency for column field=4
Addressing order field=increment
Address toggle mode field=binary count
Address stop count field=32 (4 memory locations/row * 8 rows)
Opcode field=01 binary (write)

Values of the fields for the second command (read) may be:

Data pattern field=01 binary
Flip enable field=false
Flip frequency field=Don't care
Flip enable for row field=true
Flip Frequency for row field=1
Flip enable for column field=true
Flip frequency for column field=4
Addressing order field=decrement
Address toggle mode field=binary count
Address stop count field=32
Opcode field=10 binary (read)

Many other BIST test procedures may be implemented by the present invention to achieve a variety of self-test capabilities. In another example, the March C algorithm may be implemented using six commands. The March C algorithm is generally defined as (↑w0)(↑r0w1)(↑r1wo)(↓r0w1) (↓r1w0)(↓r0), where ↑ indicates addressing in an ascending order, ↓ indicates addressing in a descending order, w indicates writing, r indicates reading, 0 indicates the logical zero, and 1 indicates the logical one. The six commands may have the following fields in common:

Flip enable field=false
Flip frequency field=Don't care
Flip enable for row field=false
Flip frequency for row field=Don't care
Flip enable for column field=false
Flip frequency for column field=Don't care
Address toggle mode field=binary count
Address stop value field=depth of the memory block The first command of the March C algorithm (↑w0) may be:

Data pattern field=00 binary
Address order mode=increment
Opcode field=01 (write)
The second command (↑r0w1) may be:
Data pattern field=00 binary
Address order Mode=increment
Opcode field=11 (read/complement data/write)
The third command (↑r1wo) may be:
Data pattern field=11 binary
Address order Mode=increment
Opcode field=11 (read/complement data/write)
The fourth command (↓r0w1) may be:
Data pattern field=00 binary
Address order Mode=decrement
Opcode field=11 (read/complement data/write)
The fifth command (↓r1w0) may be:
Data pattern field=11 binary
Address order Mode=decrement
Opcode field=11 (read/complement data/write)
The sixth command (↓r0) may be:
Data pattern field=00 binary
Address order Mode=decrement
Opcode field=10 binary (read)

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. The various signals of the present invention may be implemented as single-bit or multi-bit signals in a serial and/or parallel configuration.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a decoder configured to (i) decode a command signal into an address field, an operation field, and a data field and (ii) present a control signal to a memory block in response to said operation field; and
    a generator configured to (i) present an address signal to said memory block in response to said address field and (ii) present a data signal to said memory block in response to said data field.

2. The circuit according to claim 1, wherein said data field comprises:
    a data pattern field representing a pattern of at least one data bit, wherein (i) at least one instance of said pattern forms a data unit and (ii) at least one instance of said data unit forms said data signal; and
    a flip frequency field representing a number of instances of said pattern within each said data unit.

3. The circuit according to claim 1, wherein said address field comprises
    an address order field representing a selection between addressing said memory block in an ascending order and a descending order.

4. The circuit according to claim 1, wherein (i) at least one memory location of said memory block forms a row unit and (ii) said address field comprises
    a flip frequency row field representing a number of said memory locations within each said row unit.

5. The circuit according to claim 1, wherein (i) at least one column of said memory block defines a column unit and (ii) said address field comprises
    a flip frequency column field representing a number of rows within each said column unit.

6. The circuit according to claim 5, wherein (i) at least one column of said memory block defines a column unit and (ii) said address field address field comprises a flip enable column field representing a selection between complementing and not complementing data within every other said column unit within said memory block.

7. The circuit according to claim 1, wherein said operation field represents a selection among (i) writing to a plurality of memory locations of said memory block followed by reading from said plurality of memory locations, (ii) writing to said plurality of memory locations, and (iii) reading from said plurality of memory locations.

8. The circuit according to claim 7, wherein said selection further includes (iv) (a) reading a plurality of signals from said plurality of memory locations respectively, (b) complementing said plurality of signals to form a plurality of complemented signals respectively, and (c) writing said plurality of complemented signals to said plurality of memory locations respectively.

9. The circuit according to claim 1, further comprising a first-in-first-out memory configured to (i) queue a plurality of said command signals and (ii) present said plurality of said command signals sequentially to said decoder.

10. The circuit according to claim 1, further comprising a tester configured to present a plurality of said command signals to said decoder.

11. The circuit according to claim 1, wherein said control signal comprises:
    a pattern field;
    a flip frequency field;
    a flip enable field;
    an address order field;
    an address toggle field;
    an address stop count field;
    a flip frequency row field;
    a flip enable row field;
    a flip frequency column field;
    a flip enable column field; and
    an opcode field representing a selection among read, write, combination write/read, and combination read/write operations.

12. The circuit according to claim 1, wherein said decoder is further configured to wait for reception of a next command signal in response to completing an execution of said command signal.

13. The circuit according to claim 1, wherein said data field further comprises:
    a data pattern field representing a pattern of at least one data bit, wherein (i) at least one instance of said pattern forms a data unit and (ii) at least one instance of said data unit forms said data signal; and
    a flip enable field representing a selection between complementing and not complementing each said at least one data bit within every other said data unit of said data signal.

14. The circuit according to claim 1, wherein said address field comprises an address toggle field representing a selection between stepping said address signal as a binary count and toggling a maximum number of bits per step.

15. The circuit according to claim 1, wherein said address field comprises an address stop count field representing a depth of said memory block.

16. The circuit according to claim 1, wherein (i) at least one memory location of said memory block forms a row unit and (ii) said address field comprises a flip enable row field representing a selection between complementing and not complementing data within every other said row unit within said memory block.

17. A method of testing a memory block comprising the steps of:
(A) decoding a command signal into an address field, an operation field, and a data field;
(B) presenting a control signal to said memory block in response to decoding said operation field;
(C) presenting an address signal to said memory block in response to decoding said address field; and
(D) presenting a data signal to said memory block in response to decoding said data field.

18. The method according to claim 17, wherein step (D) further comprises the sub-steps of:
forming a data unit from at least one instance of a pattern;
forming said data signal from at least one instance of said data unit; and
complementing each said at least one data bit within every other said data unit within said data signal in response to a flip enable field within said data field having a true state.

19. The method according to claim 17, wherein step (C) further comprises the sub-step of:
addressing said memory block in one of (i) an ascending order and (ii) a descending order.

20. The method according to claim 17, wherein step (D) further comprises the sub-steps of:
forming a row unit from at least one memory location of said memory block; and
complementing data within every other said row unit within each row of said memory block in response to a flip enable row field of said address field having a true state.

21. The method according to claim 17, wherein step (D) further comprises the sub-steps of:
forming a column unit from at least one column of said memory block; and
complementing data within every other said column unit within said memory block in response to a flip enable column field of said address field having a true state.

22. The method of claim 17, further comprises the steps of:
writing to all memory locations of said memory block in response to said operation field in a first state; and
reading from said all memory locations in response to writing.

23. The method according to claim 17, further comprising the steps of:
(E) reading data from a first memory location of said memory block in response to said operation field in a state;
(F) complementing said data to form a complemented data in response to step (E);
(G) writing said complemented data to said first memory location; and
repeating steps (E), (F), and (G) for each memory location of said memory block.

24. The method according to claim 22, further comprising the step of:
writing to said all memory locations in response to said operation field in a second state.

25. The method according to claim 22, further comprising the step of:
reading from said all memory locations in response to said operation field in a second state.

26. The method according to claim 17, further comprising the steps of:
(E) presenting a done signal indicating completion of said steps (B), (C), and (D); and
(F) repeating steps (A) through (E) with another command signal in response to step (E).

27. The method according to claim 17, wherein step (C) further comprises the sub-step of:
stepping said address signal in one of (i) a binary count and (ii) toggling a maximum number of bits per step.

28. A circuit comprising:
means for decoding a command signal into an address field, an operation field, and a data field;
means for presenting a control signal to said memory block in response to decoding said operation field;
means for presenting an address signal to said memory block in response to decoding said address field; and
means for presenting a data signal to said memory block in response to decoding said data field.

* * * * *